United States Patent [19]

de Rivieré

[11] Patent Number: 4,511,864

[45] Date of Patent: Apr. 16, 1985

[54] MODULATING DEVICE FOR A SINGLE-SIDEBAND MODULATION SYSTEM

[75] Inventor: Charles de Riviéré, Paris, France

[73] Assignee: Thomson-CSF, Paris, France

[21] Appl. No.: 457,390

[22] Filed: Jan. 12, 1983

[30] Foreign Application Priority Data

Jan. 26, 1982 [FR] France .................. 82 01205

[51] Int. Cl.³ .............................................. H03C 1/60
[52] U.S. Cl. ...................................... 332/41; 332/45; 332/48; 455/109
[58] Field of Search ............... 332/41, 45, 48; 455/47, 455/48, 61, 109

[56] References Cited

U.S. PATENT DOCUMENTS

| | | | |
|---|---|---|---|
| 2,059,719 | 11/1936 | Wilson et al. ............. | 179/1.5 S X |
| 2,848,687 | 8/1958 | Stanphill .................. | 332/45 |
| 2,852,749 | 9/1958 | Miedke .................... | 332/45 |
| 2,903,518 | 9/1959 | Kahn ....................... | 332/40 X |
| 3,003,036 | 10/1961 | Greefkes .................. | 332/45 X |
| 3,300,720 | 1/1967 | Kowols .................... | 455/109 X |

OTHER PUBLICATIONS

Weaver, Jr., D. K., "A Third Method of Generation and Detection of Single-Sideband Signals", Proceedings of the IRE, Dec. 1956, pp. 1703–1705.

Primary Examiner—Eugene R. LaRoche
Assistant Examiner—W. R. Paxman
Attorney, Agent, or Firm—Cushman, Darby & Cushman

[57] ABSTRACT

The modulating device reduces the number of electronic functions required for generating an SSB signal which is subjected to SSB peak-limiting in a transmitter which is selectively operable either on the upper channel or on the lower channel. By means of a mixer, the signal delivered by the peak-limiter is mixed with a signal whose frequency is double that of the local oscillator. By filtering the signal thus obtained by means of the filter which is symmetrical with the filter employed for carrying out SSB modulation, the signal to be transmitted on one of the channels is thus obtained. The signal to be transmitted on the other channel is obtained by reversing the position of the two filters.

6 Claims, 3 Drawing Figures

MODULATING DEVICE FOR A SINGLE-SIDEBAND MODULATION SYSTEM

BACKGROUND OF THE INVENTION

1. Field of the Invention

This invention relates to a modulating device for a modulation chain of the single-sideband (SSB) type.

SSB modulation consists in amplitude-modulating a carrier wave delivered by a local oscillator and in carrying out filtering of the modulated signal thus obtained with a view to retaining only one sideband of the frequency spectrum of the modulated signal. A distinction is drawn between lower SSB modulation which retains the modulated signal having a lower frequency than the carrier-wave frequency, and upper SSB modulation which retains the modulated signal having a frequency which is higher than the carrier-wave frequency.

This method of modulation offers an advantage over conventional amplitude modulation and at equal transmitter power in that the signal-to-noise ratio is improved at the transmission end by a quantity equal to 9 dB. This gain is a well-known result of SSB modulation and is the feature which makes the method attractive.

When a limitation is imposed on the transmitter power output (technical limitation in long-range transmitters or administrative limitation in configurations relating to allocation of the different frequency ranges), it is still possible to improve the signal-to-noise ratio by modifying the actual shape of the modulating signal.

Especially in the case of speech, the modulating signal in fact exhibits a substantial amplitude variation of the order of approximately 10 dB. This is caused by the presence of plosive syllables which usually begin with letters such as b, p, or t, and this holds true even in the case of a speaker who has a uniform tone of voice. The nominal transmission power of a transmitter is therefore assigned to the transmission of these signals of maximum strength. In point of fact, however, these signals represent only a small proportion of the quantities of information to be transmitted and are not entirely necessary for intelligibility of a message. Let $P_{max}$ be the peak power developed by a transmitter in order to transmit these high-amplitude signals and let $P_{mean}$ be the mean value of the power developed in order to transmit the greater part of the messages. It is known in this case that the ratio of useful signal to noise is equal to $P_{mean}/P_{noise}$ and that the nominal power of the transmitter is equal to the peak value $P_{max}$. It may thus be readily deduced that the power transmitted practically continuously by the transmitter is lower than its nominal power and that the signal-to-noise ratio can be improved in the proportion $P_{max}/P_{mean}$.

2. Description of the Prior Art

A first solution conceived in the prior art for reducing this variation in vocal amplitude consisted in clipping the modulating signal. This produced a rapid limitation, however, as a result of losses in intelligibility arising from distortions. A second solution proposed in the prior art consisted in regulating the gain of the SSB transmission system by means of an automatic device known as a compressor and in giving said compressor a time constant of the order of 20 to 50 ms. Under these conditions, consideration was not given to the variation in amplitude due to the plosive syllables (not even those which had the lowest frequency) but was given solely to the different intonations or tones of voice adopted by a speaker. This device permitted an improvement in the signal-to-noise ratio of approximately 6 dB.

The most effective method which permits a maximum increase in the mean power and therefore in the signal-to-noise ratio without any appreciable impairment of intelligibility consists in clipping the SSB signal by reason of the fact that, in SSB transmission, part of the quantity of information to be transmitted is conveyed by means of a phase modulation of the carrier wave. This can be explained as follows: let $\omega_p$ be the angular frequency of the carrier wave and let $\omega_m$ be the angular frequency of the modulating signal; the value of the modulated signal in SSB transmission is m cos $(\omega_p \pm \omega_m)$ t, depending on whether a higher or lower SSB modulation is performed. Peak-limiting or clipping in SSB transmission consists in modifying m when m is too high by reason of a modulating signal of excessive strength. After clipping, said signal is certainly m' cos $(\omega_p \pm \omega_m)$ t, with m'>m, but nevertheless contains the information $\omega_m$ which is capable of ensuring intelligibility of the message. Under these conditions, the mean transmission power can be closer in value to the nominal power of the transmitter and the signal-to-noise ratio can come as close as possible to its maximum value.

In the prior art, the above-mentioned SSB peak-limiting operation performed after SSB filtering entailed the need for complementary filtering in order to limit the frequency band swept by the modulated signal solely to its useful portion. In fact, although SSB peak-limiting does not modify the spectrum of the modulated signal to any appreciable extent, a consequence of peak-limiting is nevertheless that it produces harmonics of said modulated signal. It is necessary to remove these harmonics prior to transmission. From a practical standpoint, the requisite complementary filter is identical with the first SSB filter.

Furthermore, it is recognized that there is now a real need, in industry, for the construction of SSB transmitters which are capable of transmitting at will on one of the two channels: the upper SSB channel or the lower SSB channel. This need is particularly critical in the field of radio transmission, in which channel switching is a common practice for overcoming certain disadvantages of transmission of radio waves in the atmosphere. In order to equip these two channels with the last-mentioned device, it is necessary to provide two pairs of filters, namely a pair of filters tuned to the lower-frequency band and a pair of filters tuned to the upper-frequency band. These filters are of the quartz type in particular, are produced one by one in accordance with a highly elaborate technology involving a large number of manual operations and are consequently very costly. For these reasons it is important to reduce the number of filters to a minimum.

SUMMARY OF THE INVENTION

The aim of the invention is to associate two devices, namely a device consisting of two-channel transmitters having a lower SSB channel and an upper SSB channel, and an SSB peak-limiting device for increasing the signal-to-noise ratio while halving the number of filters required for performing these operations with respect to the number of filters employed in the prior art.

The invention consists of a modulating device for a modulation system of the single-sideband (SSB) type, said device being distinguished by the fact that it comprises:

a first modulator for the modulation of a first carrier signal by a modulating signal and for delivering a first modulated signal having a first lower sideband and a first upper sideband;

a first filter for receiving the first modulated signal, for eliminating one of the two first sidebands and delivering the other sideband;

a signal-processing device for processing the signal delivered by the first filter;

a second modulator for the modulation of a second carrier signal by the signal delivered by the signal-processing device, the frequency of said second carrier signal being double the frequency of the first carrier signal, and for delivering a second modulated signal having a component within the sideband which is eliminated by the first filter;

and a second filter for receiving the second modulated signal, for eliminating the sideband retained by the first filter and for delivering the second sideband which is identical with the first sideband eliminated by the first filter.

BRIEF DESCRIPTION OF THE DRAWINGS

Other features of the invention will be more apparent upon consideration of the following description and accompanying drawings, wherein.

In these different figures, the same references designate the same elements.

DESCRIPTION OF THE PREFERRED EMBODIMENTS

In accordance with the invention, by placing a lower SSB filter on the downstream side of a mixer which serves to mix the modulating signal having a frequency $f$ and the carrier wave emitted by a local oscillator having a frequency $Fol$, the mixture $Fol \pm f$ which passes out of the mixer becomes $Fol - f$. A signal-processing device located downstream of the mixer does not produce any fundamental modification in the spectrum of the signal just mentioned. In other words, the spectrum of the signal which emerges from said signal-processing device contains on the one hand the components $Fol - f$ and on the other hand harmonics of said signal. More particularly in the case under consideration, this signal-processing device will be a SSB peak limiter but this is not intended in any sense to impose a restrictive condition on the field of application of the invention which is much broader in scope. A second mixer having the function of mixing said signal with that of an oscillator whose frequency $2 Fol$ is exactly double the frequency of the first local oscillator produces a signal:

$$\{2 Fol \pm (Fol - f)\}$$

which can also be written:

$Fol + f$ and $3 Fol - f$

By passing into an upper SSB filter, the last-mentioned signal removes the component $3 Fol - f$ and restitutes the useful signal $Fol + f$. It will accordingly be understood that there has thus been obtained an SSB modulated signal which has been subjected to an SSB peak-limiting operation and that two different paired filters have been employed.

Figure 1:
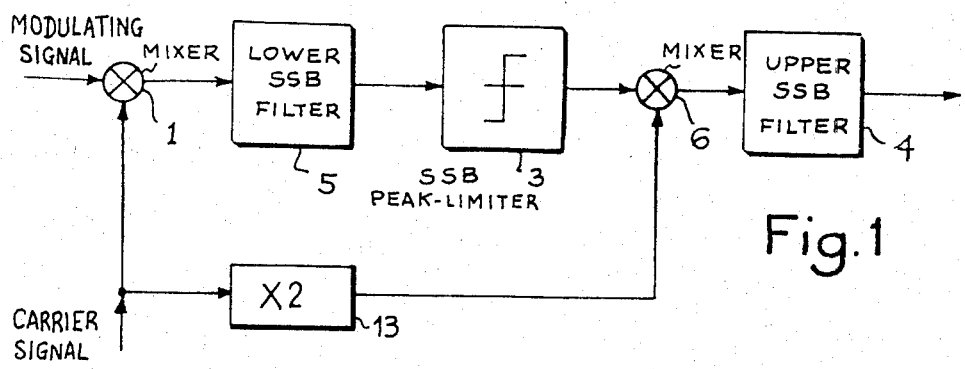
FIG. 1 shows an upper-channel SSB peak-limiting device in accordance with the invention.

The SSB modulator-limiter in accordance with the invention is shown in the diagram of FIG. 1. A modulating signal arrives on one of the channels of a mixer 1 of conventional design. A carrier wave originating from a local oscillator (not shown) and having a frequency $Fol$ arrives on the other channel. The modulated signal produced by the mixer 1 is applied to the input of a lower SSB filter 5, the design function of which is to remove the unwanted portion of the signal produced by the mixer. An SSB peak-limiter 3 is employed for the purpose of clipping the modulated signal. A mixer 6 is interposed between the SSB peak-limiter 3 and an upper SSB filter 4. The filters 4 and 5 are bandpass filters having highly selective filtering characteristics. They usually consist of a series of quartz cells in which the number of cells is directly related to the angle of slope of the flanks of the frequency-response curve of said filters. Said cells which are each fabricated from a quartz base are endowed with high selectivity of the order of a few kilohertz in the vicinity of an oscillator frequency of several megahertz. Adjustment of tuning of said filters is a very delicate but highly precise operation. The mixer 6 receives a signal delivered by the SSB peak-limiter 3 and a signal emitted by a multiplier 13 of the local oscillator carrier signal. The frequency of the signal emitted by the multiplier is exactly double the frequency of the initial carrier wave. The signal delivered by said mixer 6 therefore has a spectrum of components $Fol + f$ and of components $3 Fol - f$ as stated earlier. In fact, the signal delivered by the SSB peak-limiter 3 is obtained by heterodyning the modulating signal designated as BF and having a frequency $f$ with the signal emanating from a local oscillator (not shown in the drawings) having a frequency $Fol$. Heterodyning is performed in a mixer 1 of a type already known in the prior art. The spectrum of the signal which passes out of the mixer 1 includes in particular the components $Fol - f$ and $Fol + f$. The passage of said signal through the lower SSB filter 5 suppresses the component $Fol + f$. The component $Fol - f$ therefore remains. After passing out of the lower SSB filter 5, said signal is applied to the input of the SSB peak-limiter 3 which, among other functions, initiates the generation of harmonics of the signal $Fol - f$. The signal delivered by said SSB peak-limiter 3 is in turn applied to one of the channels of the mixer 6. The signal having a frequency $2 Fol$ and delivered by the multiplier 13 is applied to the other channel of said mixer 6. Heterodyning of the two last-mentioned signals within the mixer 6 produces a signal whose spectrum has the significant components:

$2 Fol - (Fol - f)$ and $2 Fol + (Fol - f)$.

This may also be written:

$Fol + f$ and $3 Fol - f$.

The upper SSB filter 4 makes it possible to recover at the output the signal having a spectrum $Fol + f$ by eliminating the component $3 Fol - f$ as well as the undesired harmonics which are emitted by the SSB peak-limiter 3 and may be transposed by the modulator 6. The device of FIG. 1 therefore permits transmission on the upper channel.

Figure 2:
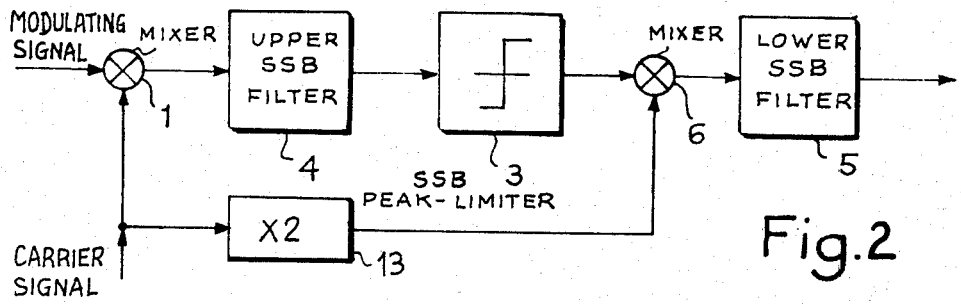
FIG. 2 shows a lower-channel SSB peak-limiting device in accordance with the invention.

FIG. 2 represents a configuration which is symmetrical with the preceding arrangement and in which the upper SSB filter 4 and lower SSB filter 5 have been reversed. The device of FIG. 2, which is symmetrical with the device of FIG. 1, permits transmission on the lower channel. In each of these two configurations, it is noted that two filters alone have been employed, namely an upper SSB filter 4 and a lower SSB filter 5.

By means of two paired filters, a switching device makes it possible to provide a modulating device in accordance with the invention on either of the two channels, namely the upper channel or the lower channel. Said switching device will now be described with reference to FIG. 3. In this figure, there is shown in particular a set of switching elements 9, 10, 11 and 12 which direct the signal on a path selected in accordance with one of the two configurations described with reference to FIGS. 4 and 5. Operation of all these switching elements 9, 10, 11 and 12 is simultaneous in accordance with a known arrangement of the prior art (not shown in the figure). In this figure, it will be observed in particular that provision is made for a switch 9 which enables the signal delivered by the modulator 1 to drive the upper SSB filter 4. The signal delivered by said filter 4 is directed by the switch 10 to the input of an SSB peak-limiter 3. The output of said peak-limiter 3 is applied to the input of a mixer 6 in accordance with the invention. The output of said mixer 6 is directed toward the input of the lower SSB filter 5 via the switch 11. The signal which passes out of said lower SSB filter 5 is directed toward subsequent processing by means of the last switch 12. It is worthy of note that, if all the switches 9, 10, 11 and 12 are operated together, the signal will follow a symmetrical path and will be directed to subsequent processing from the output of the upper SSB filter 4 by passing through the switch 10. The first configuration permits transmission on the lower channel and the second configuration permits transmission on the upper channel. It is therefore apparent that, by means of a single set of two paired filters and by means of a set of switches, SSB modulation and peak-limiting can be performed on each channel.

A device conceived in accordance with this general arrangement finds a particularly suitable application in double-channel SSB transmitters.

Since SSB receivers also make use of SSB filters associated with the transmission, the filters shown in the drawings are also capable of performing this function.

Figure 3:
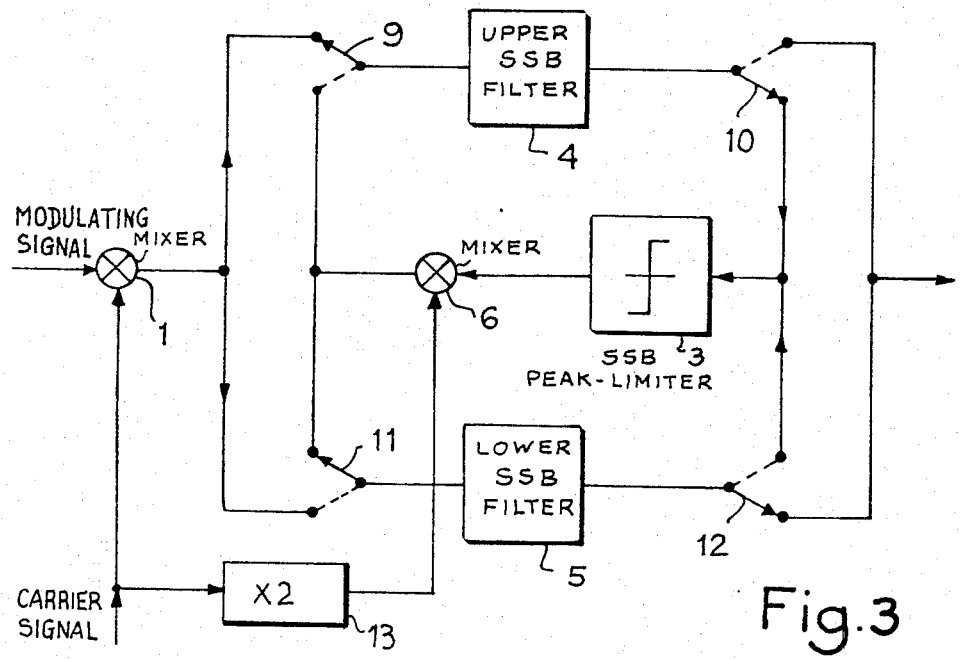
FIG. 3 shows a double-channel SSB peak-limiting device in accordance with the invention.

A device designed in accordance with the general configuration of FIG. 3 therefore also finds an application in double-channel transmitter-receivers.

What is claimed is:

1. A modulating device for a modulation system of the single-sideband type, wherein said device comprises:
   a first modulator for the modulation of a first carrier signal by a modulating signal and for delivering a first modulated signal having a first lower sideband and a first upper sideband;
   a first filter, for receiving the first modulated signal, for eliminating one of the two first sidebands and delivering the other sideband;
   a signal-processing device for processing the signal delivered by the filter;
   a second modulator for the modulation of a second carrier signal by the signal delivered by said signal processing device, the frequency of said second carrier signal being double the frequency of said first carrier signal, and for delivering a second modulated signal having a component within the sideband which is eliminated by said first filter;
   and a second filter for receiving a modulated signal, for eliminating the sideband retained by the first filter and for delivering the second sideband which is identical with the first sideband eliminated by said first filter.

2. A device according to claim 1, wherein said device further comprises a frequency doubler for receiving the first carrier signal and delivering the second carrier signal.

3. A device according to claim 1, wherein the first filter is a lower single-sideband filter and wherein the second filter is an upper single-sideband filter, the function of said device being to deliver a single-sideband signal corresponding to an upper channel for the carrier wave employed.

4. A device according to claim 1, wherein the first filter is an upper single-sideband filter and wherein the second filter is a lower single-sideband filter, the function of said device being to deliver a single-sideband signal corresponding to a lower channel for the carrier wave employed.

5. A device according to claim 1, wherein said device further comprises switching means for interchanging the filters so as to obtain an output signal corresponding to an upper channel or to a lower channel for the carrier wave employed.

6. A device according to claim 1, wherein the signal-processing device is a single-sideband peak-limiter.

* * * * *